United States Patent [19]

Nakaso et al.

[11] Patent Number: 5,736,065

[45] Date of Patent: Apr. 7, 1998

[54] CHEMICAL REDUCING SOLUTION FOR COPPER OXIDE

[75] Inventors: Akishi Nakaso, Oyama; Youichi Kaneko, Shimodate, both of Japan

[73] Assignee: Hitachi Chemical Company, Ltd., Tokyo, Japan

[21] Appl. No.: 815,599

[22] Filed: Mar. 12, 1997

Related U.S. Application Data

[63] Continuation of Ser. No. 382,583, Feb. 2, 1995, abandoned.

[30] Foreign Application Priority Data

Feb. 2, 1994 [JP] Japan ................................. 6-010737

[51] Int. Cl.$^6$ .............................. C01B 6/10; C09K 15/02
[52] U.S. Cl. ................... 252/188.26; 252/188.1; 427/98; 427/437; 427/443.1
[58] Field of Search .................... 252/188.1, 188.26; 427/437, 443.1, 98; 106/1.11, 1.23, 1.26, 1.05

[56] References Cited

U.S. PATENT DOCUMENTS

| | | | |
|---|---|---|---|
| 2,643,199 | 6/1953 | Hersch | 117/50 |
| 4,295,986 | 10/1981 | Gordon | 252/188.26 |
| 4,548,644 | 10/1985 | Nakaso et al. | 106/1.23 |
| 4,563,217 | 1/1986 | Kikuchi et al. | 106/1.23 |
| 4,634,468 | 1/1987 | Gulla et al. | 106/1.11 |
| 4,642,161 | 2/1987 | Akahoshi et al. | 216/35 |
| 4,725,314 | 2/1988 | Gulla et al. | 106/1.11 |
| 4,770,751 | 9/1988 | Kawagishi et al. | 205/169 |
| 4,838,937 | 6/1989 | Ott | 106/1.23 |
| 4,966,786 | 10/1990 | Ehrich et al. | 427/97 |

FOREIGN PATENT DOCUMENTS

| | | |
|---|---|---|
| 14101318 | 1/1991 | Germany . |
| 14108073 | 3/1991 | Germany . |
| 394202 | 12/1960 | Japan . |
| 153797 | 11/1981 | Japan . |
| 176192 | 8/1986 | Japan . |
| 156479 | 6/1989 | Japan . |

OTHER PUBLICATIONS

Chemical Abstract No. 119:48993, Entitled "Preparation of Benzhydrol by Peg Catalysis", by Li et al., Taken From: Huaxue Shiji (1993).

Chemical Abstract No. 119:27657, Entitled "Using Sodium Borohydride Polyethylene Glycol Methyl Ether 400 as an Effective Reducing Agent Under PCT Conditions", by Blantan et al., Taken From: J. Microchem, (1993).

Chemical Abstract No. 121:115334, Entitled: "Solutions for Treatment of Oxidized Nonferrous Metals Before Electroless Plating", by Nakazawa et al. (Feb. 22, 1994).

Chemical Abstract No. 98:52716, Entitled: "Catalytic Activity of Polyethylene Glycols in the Reduction of Carbonyl Compounds Under Phase-Transfer Catalyzed Conditions", by Zupancic, Taken From: Synthetic Commun . (1982).

Zupancic, B.G. et al. "Catalytic Activity of Polyethylene Glycols in the Reduction of Carbonyl Compounds Under Phase-Transfer Catalyzed Conditions" Taken From: Synthetic Communications, vol. 12, No. 11, (1982), pp. 881–886.

Primary Examiner—Joseph D. Anthony
Attorney, Agent, or Firm—Antonelli, Terry, Stout & Kraus, LLP

[57] ABSTRACT

A chemical reducing solution obtained by using an alkali boron hydride as a reductant and adding thereto a water-soluble, polyoxyethylene chain-containing organic compound having a molecular weight of 200 or above molecule as an additive has merits in that it can reduce copper oxide to metallic copper while maintaining the needle-like form of copper oxide as completely as possible and the reduction can be completed in a short period of time by a simple procedure, so that the chemical reducing solution is successfully usable in a process for producing a multi-layer printed circuit board.

5 Claims, 3 Drawing Sheets

CHEMICAL REDUCING SOLUTION FOR COPPER OXIDE

This application is a Continuation application of application Ser. No. 08/382,583, filed Feb. 2, 1995 now abandoned.

BACKGROUND OF THE INVENTION

The present invention relates to a chemical reducing solution for chemically reducing copper oxide to metallic copper while confining the change in the form of the copper oxide to a slight change, and a process for producing a multi-layer printed circuit board improved in the adhesion between copper and resin by the use of said chemical reducing solution.

Copper oxide has a form of whisker, namely a needle-like form. Such copper oxide can be obtained by heating metallic copper (literature: Copper Oxide Whisker, Kinou Zairyo, Vol 12, No. 12 (December, 1992), or by dipping metallic copper in an alkaline aqueous solution containing an oxidant such as oxo-disulfate, chlorite or the like.

As above, copper oxide has a needle-like form. If such copper oxide can be reduced to metallic copper while maintaining the needle-like form nearly completely, a powdery copper oxide will give a needle-form metallic copper which is expected to be useful as an electroconductive filler for use in electroconductive pastes.

There is known a technique for forming a needle-form copper oxide on the surface of metallic copper and improving adhesive force between copper and a resin by entanglement of the fine needles and the resin. In order to improve acid resistance of the adhesion part, it is desired to reduce the copper oxide needles to metallic copper while retaining the needle-like form of copper oxide as completely as possible, and methods for such a reduction are disclosed in JP-B-64-8479, JP-A-176192 and JP-A-1-156479.

Among these patent gazettes, JP-B-64-8479 mentions that, if an inner layer circuit board is formed and then copper oxide is formed on the surface of metallic copper constituting the inner circuit and the copper oxide is contacted with an aqueous alkaline solution containing a reductant, the copper oxide can be reduced to metallic copper. The same patent gazette as above further discloses a method for producing a multi-layer printed circuit board by carrying out the above-mentioned reduction, drying the reduced product and then laminating the inner layer circuit board thus obtained with a prepreg.

For the same purpose as above, JP-A-61-176192 discloses a method of using dimethylaminoborane as a reductant for copper oxide; and JP-A-1-156479 discloses a method of using sodium boron hydride and formaldehyde as reductants for copper oxide in the solutions of which metallic copper is dipped successively.

From the viewpoint of industrial technique, the important points in the chemical reduction of copper oxide mentioned above consist in that copper oxide must be reduced to metallic copper while maintaining the needle-like form of copper oxide as completely as possible, that the reduction must be completed in a short period of time, that the procedure of the reduction must be simple, and that the reductant used for the reduction must not be costly. Among these conditions, the lowness in cost is quite important in an industrial technique for mass production.

Now, when sodium boron hydride is used as a reductant as disclosed in JP-B-64-8479, characteristic properties of the reductant are governed by pH value of the reducing solution containing the reductant. That is, when pH of reducing solution is lower than 11, the reduction can progress while nearly completely maintaining the needle-like form of copper oxide and the reduction can be completed in a relatively short period of time.

Further, sodium boron hydride is lower in cost as a chemical agent than other effective boron type reductants such as dimethylamineborane.

When sodium boron hydride is used at a pH value of lower than 11, however, its large portion is consumed by a spontaneous decomposition so that sodium boron hydride is costly as a result.

When sodium boron hydride is used at a pH value of 11 or above, its consumption by spontaneous decomposition is suppressed to a considerable extent. Under such a condition, however, there remain unsolved problems that the reduction takes a long period of time and the needle-like form of copper oxide readily changes to a granular form.

Next, the method of using dimethylamineborane as a reductant as disclosed in JP-A-61-176192 has a problem that this agent is quite costly as compared with other effective reductants, even though this agent makes it possible to reduce copper oxide to metallic copper while maintaining the needle-like form of copper oxide nearly completely with a high rate of reduction and with a relatively small extent of spontaneous decomposition.

Next, in the method of using sodium boron hydride and formaldehyde as reductants and dipping copper oxide in solutions of the two reductants successively, sodium boron hydride can be used at a high pH value because it is used for advancing the reduction only partially, and its consumption by spontaneous decomposition can be confined to a small extent. Further, formaldehyde used for completely reducing copper oxide to metallic copper is quite inexpensive as compared with other reductants. However, this method is disadvantageous in that it uses two kinds of reductants and the process is too long.

SUMMARY OF THE INVENTION

It is an object of the present invention to provide a chemical reducing solution which satisfies a condition that it can reduce copper oxide to metallic copper while maintaining the needle-like form of copper oxide as completely as possible and, in addition, simultaneously satisfies the conditions that it can reduce copper oxide in a short period of time by a simple procedure and that the reductant used for the reduction is relatively low in cost; and a process for producing a multi-layer printed circuit board using said chemical reducing solution.

The present invention provides a chemical reducing solution for chemically reducing copper oxide to metallic copper containing an alkali boron hydride and, as an additive, a water-soluble organic compound having a molecular weight of 200 or above and containing a polyoxyethylene chain in molecule.

The present invention further provides a process for producing a multi-layer printed circuit board which comprises, after formation of an inner layer circuit board, forming copper oxide on the surface of the inner layer circuit, reducing the copper oxide through contact with a chemical reducing solution containing an alkali boron hydride and a water-soluble organic compound having a molecular weight of 200 or above and a polyoxyethylene chain in molecule, and thereafter laminating on the surface thereof a prepreg or an insulating adhesive film.

The present invention further provides a process for producing a multi-layer printed circuit board which comprises forming copper oxide on the surface of a copper-clad laminated board for use in the formation of an inner layer circuit board, reducing the copper oxide through contact with a chemical reducing solution containing an alkali boron hydride and a water-soluble organic compound having a molecular weight of 200 or above and a polyoxyethylene chain in molecule, then etching off the copper foil which has formed copper oxide not constituting the inner layer circuit, and thereafter laminating on the surface thereof a prepreg or an insulating adhesive film.

DESCRIPTION OF THE PREFERRED EMBODIMENTS

Figure 1:
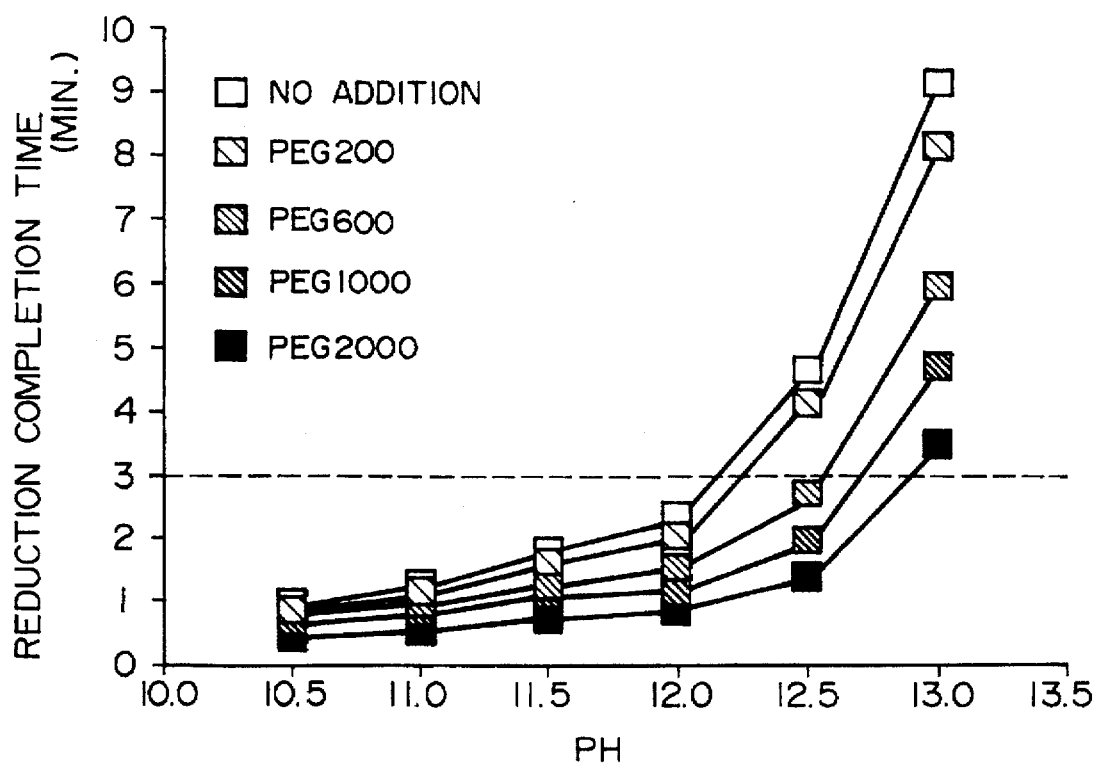
FIG. 1 is a graph explaining the effect of the invention, wherein the relation between pH value of reducing solution and reducing rate is illustrated by using molecular weight of additive as a parameter.

After extensive studies, the present inventors found that the problems mentioned above can be solved by using an alkali boron hydride as a chemical reducing agent and adding thereto, as an additive, a water-soluble organic compound having a molecular weight of 200 or above and a polyoxyethylene chain in molecule. Based on this finding, the present invention was accomplished.

As the alkali boron hydride used in the present invention, at least one member selected from the group consisting of sodium boron hydride, potassium boron hydride, lithium boron hydride and the like can be used. Concentration of the alkali boron hydride is 0.1 g/liter or above, and further preferably from 0.5 g/liter to 10 g/liter.

If the concentration of alkali boron hydride is lower than 0.1 g/liter, the reducing rate is remarkably low. Even if the concentration is high, it makes no trouble on the reduced metallic copper. However, if the concentration exceeds 10 g/liter, the consumption rate of alkali boron hydride in the reducing solution becomes high due to spontaneous decomposition, which is uneconomical.

pH value of the aqueous solution of alkali boron hydride is preferably 11 or above, from the viewpoint of prevention of spontaneous decomposition of alkali boron hydride.

As the water-soluble organic compound having a molecular weight of 200 or above and a polyoxyethylene chain in molecule which can be used as the additive, polyethylene glycol can be referred to. Polyethylene glycol includes many homologues of which molecular weight ranges from about 200 to several millions, and they are all usable in the invention.

In the invention, ether type water-soluble organic compounds having a polyoxyethylene chain such as single chain length polyoxyethylene alkyl ethers, polyoxyethylene secondary alcohol ethers, polyoxyethylene alkylphenyl ethers, ethylene oxide derivatives of alkylphenol-formaldehyde condensates, polyoxyethylene-polyoxypropylene block polymers, and the like can be used.

Further, in the invention, ether-ester type water-soluble organic compounds such as polyoxyethylene-glycerin fatty acid esters, polyoxyethylene-caster oil, polyoxyethylene-hydrogenated caster oil, polyoxyethylene-sorbitan-fatty acid esters, polyoxyethylene-sorbitol fatty acid esters, and the like can be used. Further, polyoxyethylene glycol fatty acid esters can be used as an ester type water-soluble organic compound, and polyoxyethylene-fatty acid amides and polyoxyethylene-alkylamines can also be used as nitrogen-containing water-soluble organic compounds.

In the practical use, at least one of these water-soluble organic compounds is added.

Concentration of the additive is preferably 0.01 g/liter or above and further preferably 0.05 g/liter or above. Although upper limit of the concentration varies depending on the kind of additive, an additive may be added up to the solubility limit of the additive. If the amount of additive exceeds its solubility, the solution becomes turbid, and an insoluble matter is deposited on the surface to bring about an undesirable result.

As has been mentioned above, a study of the present inventors has revealed that there is a definite relation between the increase of reducing rate and the kind of additive. When polyethylene glycol is used as the additive, a higher molecular weight gives a higher reducing rate.

When water-soluble organic compounds having a polyoxyethylene chain in molecule other than polyethylene glycol are used as the additive, degree of polymerization of the polyoxyethylene chain exercises no great influence upon the reducing rate. That is, the reduction is nearly likewise accelerated by addition of any of such compounds regardless of degree of polymerization of polyoxyethylene chain.

The copper surface treatment of this invention can be applied not only to the pretreatment of internal circuits to be subjected to multi-layer adhesion, but also to circuit surface treatment before the formation of a resist on a printed circuit board, or copper surface treatment before adhesion of a flexible substrate and copper foils in order to improve the adhesive strength between the copper foil and a resin layer.

A multi-layer printed wiring board can be produced by piling a plurality of the thus treated wiring boards having been formed internal layer circuits and a plurality of prepregs obtained by impregnating a substrate such as paper, glass cloth, etc., with a thermosetting resin and drying, alternately, followed by pressing with beating, by a conventional method.

This invention can be applied to the production of multi-layer printed wiring boards obtained by adhering internal layer wiring boards to prepregs; laminates of copper-clad laminates, wiring boards having conductor circuits thereon and solder resists; copper-clad laminates obtained by laminating copper foils and prepregs; substrates for flexible wiring boards obtained by laminating copper foils and flexible films, etc.

Thus, a multi-layer printed circuit board can be produced by a process comprising after formation of an inner layer circuit board, forming copper oxide on the surface of the inner layer circuit, reducing the copper oxide through contact with a chemical reducing solution containing an alkali boron hydride and a water-soluble organic compound having a molecular weight of 200 or above and a polyoxyethylene chain in molecule, and thereafter laminating on the surface thereof a prepreg or an insulating adhesive film.

Alternatively, the multi-layer printed circuit can be produced by a process comprising forming copper oxide on the surface of a copper-clad laminated board for use in the formation of an inner layer circuit board, reducing the copper oxide through contact with a chemical reducing solution containing an alkali boron hydride and a water-soluble organic compound having a molecular weight of 200 or above and a polyoxyethylene chain in molecule, then etching off the copper foil which has formed copper oxide not constituting the inner layer circuit, and thereafter laminating on the surface thereof a prepreg or an insulating adhesive film.

More concretely, some embodiments of the present invention are explained in detail below.

A copper-clad laminate can be obtained by subjecting one or two surfaces of copper foils to the surface treatment process of this invention; laminating one or more surface treated copper foils and one or more sheets of glass cloth or paper impregnated with an epoxy resin, a polytetrafluoroethylene resin or a polyimide resin or one or more sheets of an epoxy resin, a polytetrafluoroethylene resin or a polyimide resin with glass fibers, or laminating one or more the thus surface treated copper foils coated with an epoxy resin, a polytetrafluoroethylene resin or a polyimide resin; and subjecting to heating and pressing treatment to form a laminated unit having copper layers on the outermost surfaces.

A copper-clad flexible film can be obtained by subjecting one or both surface of copper foil to the surface treatment process of this invention; and bonding a flexible resin film to the resulting copper foil using an adhesive of epoxy resin or acrylic resin so as to have copper layers on the outermost surfaces, wherein the flexible resin film is made from polyimide, polyester, polytetrafluoroethylene, polysulfone, or polyether ether ketone.

A multi-layer wiring board can be obtained by laminating one or more copper foils and one or more sheets of glass cloth or paper impregnated with an epoxy resin, a polytetrafluoroethylene resin or a polyimide resin or one or more sheets of an epoxy resin, a polytetrafluoroethylene resin or a polyimide resin mixed with glass fibers, or laminating one or more copper foils coated with an epoxy resin, a polytetrafluoroethylene resin or a polyimide resin; subjecting to heating and pressing treatment to form a copper-clad laminate; removing unnecessary portions from the copper foil of the laminate by etching to form inner circuits on an internal layer; subjecting the copper foil thus treated to the surface treatment process of this invention; laminating on the resulting copper surface an epoxy resin, a polytetrafluoroethylene resin or a polyimide resin, or a glass cloth or paper impregnated with an epoxy resin, a polytetrafluoroethylene resin or a polyimide resin, or laminating a sheet of an epoxy resin, a polytetrafluoroethylene resin or a polyimide resin mixed with glass fibers, with repetition of laminating to form a multiple layers and a copper foil as an outermost layer; subjecting to heating and pressing treatment to form a laminated unit having copper layers on the outermost surfaces; drilling through-holes in the laminated unit; metallizing inner walls of the through-holes; and removing unnecessary portions from the outermost copper layers by etching to form circuits.

Further, a flexible wiring board can be obtained by bonding a copper foil to a flexible resin film using an adhesive of epoxy resin or acrylic resin to form a copper-clad flexible film; removing unnecessary portions from the copper foil by etching to form inner circuits on an inner layer; subjecting the copper foil thus treated to the surface treatment process of this invention; and bonding a flexible resin film from which unnecessary portions for connection are removed to the thus treated copper surface with an adhesive of epoxy resin or acrylic resin, wherein the flexible resin film is made from polyimide, polyester, polytetrafluoroethylene, polysulfone, or polyether ether ketone.

The resin layers can be used in the form of a prepreg, film, curtain coat, etc. As the resin, there can be used thermosetting resins such as epoxy resins, polyimides, etc.; thermoplastic resins such as polytetrafluoroethylene, polysulfones, polyether ether ketones, polyetherimides, etc.

Next, the present invention is illustrated by way of the following Examples.

EXAMPLE 1

A copper-clad laminate board having a thickness of 0.2 mm was immersed for 3 minutes in an aqueous solution containing 40 g/liter of sodium hydroxide and having a liquid temperature of 50° C. for the sake of alkali-defatting, and then washed with water. Subsequently, the laminate board was immersed in an aqueous solution containing 100 g/liter of ammonium peroxodisulfate and having a liquid temperature of 40° C. for the sake of soft etching of the surface, and then washed with water. Subsequently, the laminate board was immersed for 2 minutes in a copper oxide-treating solution containing 30 g/liter of sodium chlorite, 30 g/liter of sodium tertiary phosphate ($Na_3PO_4 \cdot 12H_2O$) and 20 g/liter of sodium hydroxide and having a liquid temperature of 85° C. to make progress an oxidation treatment of the copper surface of copper-lined laminate board, whereby a copper oxide film was formed on the surface.

The treated laminate board thus obtained was cut into a size of 10 mm width×150 mm length to obtain samples.

Subsequently, reducing solutions were prepared by dissolving 2 g/liter of sodium boron hydride as a reductant, adjusting pH to 10.5, 11.0, 11.5, 12.0, 12.5, 13.0 or 13.5 with sodium hydroxide, and further adding thereto no additive or 2.0 g/liter of an additive. As said additive, polyethylene glycols (hereinafter referred to as "PEG") having a molecular weight of 200, 900, 1,000 and 2,000 were used. After adjusting the liquid temperature to 40° C., the sample obtained above was immersed in each of the reducing solutions thus obtained to carry out reduction.

The results are summarized in FIG. 1, wherein reducing rate is expressed by the period of time required for reduction of copper oxide film to metallic copper.

Figure 4A:
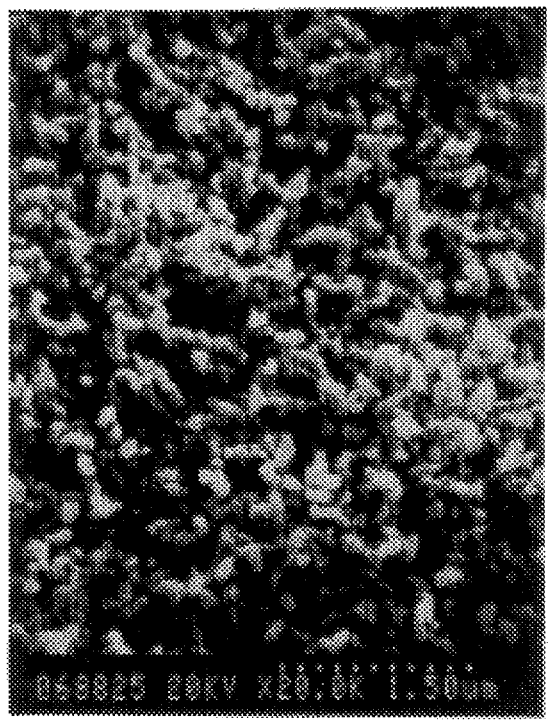
FIG. 4(A) is a microscopic photograph illustrating the state of the surface of reduced metal according to Comparative Example of the invention using a reducing solution containing no additive.

FIG. 4(A) is a scanning electron microscopic photograph at a magnification of 20,000 of a sample surface which has been reduced with a reducing solution having a pH value of 12.5 and containing no additive.

Figure 4B:
FIG. 4(B) is a microscopic photograph illustrating the state of the surface of reduced metal according to one Example of the invention.

FIG. 4(B) is a scanning electron microscopic photograph at a magnification of 20,000 of a sample surface which has been reduced with a reducing solution having a pH value of 12.5 and containing PEG having a molecular weight of 2,000 as an additive.

EXAMPLE 2

In the experiment of Example 1, composition of reducing solution was altered as follows.

As a reductant, sodium boron hydride was added in an amount of 2 g/liter. pH value of the solution was adjusted to 10.5, 11.0, 11.5, 12.0, 12.5, 13.0 or 13.5 with sodium hydroxide. To each of the solutions thus obtained, no additive was added or an additive was added. As the additive, PEG mono-oleyl ether (degree of polymerization of the PEG was 7, 10, 20 or 50) was used in an amount of 0.25 g/liter. After adjusting liquid temperature to 40° C., sample was immersed in each of the reducing solutions thus obtained to carry out a reduction.

Figure 2:
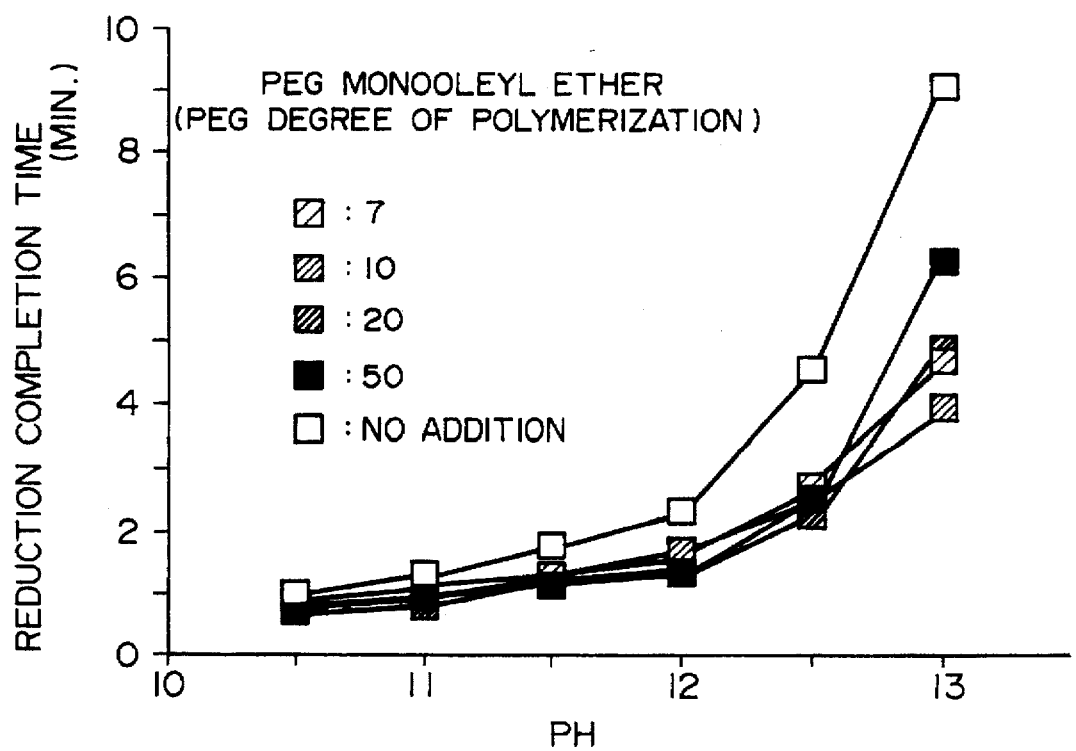
FIG. 2 is a graph explaining the function of the invention, wherein relation between pH value of reducing solution and reducing rate is illustrated by using degree of polymerization of additive as a parameter.

The results are shown in FIG. 2, wherein the reducing rate is expressed by the period of time required for reduction of copper oxide film to metallic copper.

EXAMPLE 3

In the experiment of Example 1, composition of reducing solution was altered as follows.

As a reductant, sodium boron hydride was added in an amount of 2 g/liter. pH value of the solution was adjusted to 12.5 with sodium hydroxide. Further, as an additive, PEG 2000 or PEG mono-p-nonylphenyl ether (degree of polymerization of the PEG was 20) was added in a varied amount ranging from 0 to 0.25 g/liter. After adjusting liquid temperature to 40° C., sample was immersed in each of the reducing solutions thus obtained to carry out a reduction.

Figure 3:
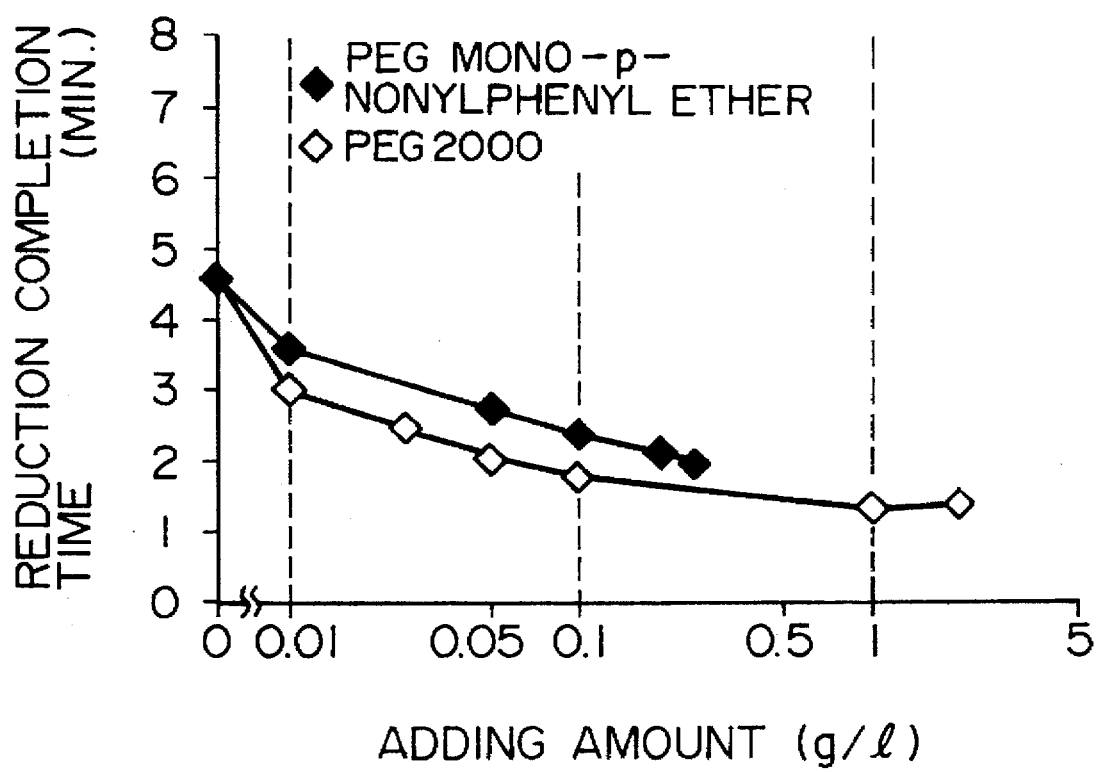
FIG. 3 is a graph explaining the function of the invention by showing the relation between the amount of additive and reducing rate.

The results are shown in FIG. 3, wherein the reducing rate is expressed by the period of time required for reduction of copper oxide film to metallic copper.

EXAMPLE 4

A copper-clad laminate board having a thickness Of 0.2 mm using a 35 µm copper foil was prepared by the method of etching. The laminate board was defatted by dipping the board for 3 minutes in an aqueous solution containing 40 g/liter of sodium hydroxide and having a liquid temperature of 50° C., and then washed with water. Subsequently, the laminate board was dipped in an aqueous solution containing 100 g/liter of ammonium peroxodisulfate and having a liquid temperature of 40° C. for the sake of a soft etching treatment of the surface, and then washed with water. Subsequently, the laminate board was dipped for 2 minutes in a copper oxide treating solution containing 30 g/liter of sodium chlorite, 30 g/liter of sodium tertiary phosphate ($Na_3PO_4 \cdot 12H_2O$) and 20 g/liter of sodium hydroxide and having a liquid temperature of 85° C. to subject the copper surface to an oxidation treatment, whereby a copper oxide film was formed.

Subsequently, the sample was reduced by dipping it in a reducing solution prepared by dissolving 2 g/liter of sodium boron hydride as a reductant, adjusting pH value of the solution to 12.5 with sodium hydroxide, further adding thereto 2.0 g/liter of PEG having a molecular weight of 2,000 as an additive, and adjusting the temperature of the solution to 40° C., after which the sample was washed with water.

Subsequently, a prepreg and an outer layer copper foil were superposed on the treated sample thus obtained, and the whole was laminated and integrated with pressure and heat under a pressure of 40 kg/cm$^2$ at a temperature of 170° C. for 90 minutes to prepare a multi-layer board.

Then, on this multi-layer board, the peeling strength of inner layer copper foil at the surface subjected to the reducing treatment was measured.

As a result, it was found that the peeling strength was 1.1 kgf/cm which was a satisfactory value as a peeling strength of inner layer copper foil of a multi-layer printed circuit board.

As has been described above, according to the present invention, there can be provided a process for producing a chemical reducing solution simultaneously satisfying the conditions that the chemical reducing solution can reduce copper oxide to metallic copper while maintaining the needle-like form of copper oxide as completely as possible, that the reduction can be completed in a short period of time by a simple procedure, and that the reductant used in the solution is relatively low in cost; and there can be further provided a process for producing a multi-layer printed circuit board using said chemical reducing solution.

What is claimed is:

1. A chemical reducing solution for chemically reducing copper oxide to metallic copper which consists essentially of an aqueous solution of an alkali boron hydride admixed with a water-soluble polyoxyethylene chain-containing organic compound having a molecular weight of 200 or above and an alkali hydroxide to provide a pH value of 11.0 or above.

2. A chemical reducing solution according to claim 1, wherein concentration of said water-soluble organic compound is 0.01 g/liter or above.

3. A chemical reducing solution according to claim 1, wherein said water-soluble organic compound is non-ionic.

4. A chemical reducing agent solution according to claim 1, wherein the organic compound is at least one member selected from the group consisting of a polyethylene glycol, polyethylene glycol mono-oleyl ether, a single chain length polyoxyethylene alkyl ether, a polyoxyethylene secondary alcohol ether, a polyoxyethylene alkylphenyl ether, an ethylene oxide derivative of an alkylphenol-formaldehyde condensate, a polyoxyethylene-polyoxypropylene block polymer, a polyoxyethylene-glycerin fatty acid ester, a polyoxyethylene-caster oil, a polyoxyethylene-hydrogenated caster oil, a polyoxyethylene-sorbitan-fatty acid ester, a polyoxyethylene-sorbitol fatty acid ester, a polyoxyethylene glycol fatty acid ester, a polyoxyethylene-fatty acid amide and a polyoxyethylene-alkylamine.

5. A chemical reducing solution according to claim 4, wherein the organic compound is a polyethylene glycol, a polyethylene glycol mono-oleyl ether, or a polyethylene glycol mono-p-nonylphenyl ether.

* * * * *